United States Patent [19]

Takeuchi et al.

[11] Patent Number: 5,023,156
[45] Date of Patent: Jun. 11, 1991

[54] MASK FOR X-RAY LITYHOGRAPHY AND METHOD OF MANUFACTURING THE SAME

[75] Inventors: Susumu Takeuchi; Nobuyuki Yoshioka, both of Hyogo, Japan

[73] Assignee: Mitsubishi Denki Kabushiki Kaisha, Tokyo, Japan

[21] Appl. No.: 405,583

[22] Filed: Sep. 11, 1989

Related U.S. Application Data

[63] Continuation of Ser. No. 168,312, Mar. 18, 1988, abandoned.

[30] Foreign Application Priority Data

Aug. 4, 1987 [JP] Japan ................................ 62-195706

[51] Int. Cl.$^5$ ............................................... G03F 9/00
[52] U.S. Cl. ........................................ 430/5; 430/321; 378/35
[58] Field of Search ..................... 430/5, 321; 378/35

[56] References Cited

U.S. PATENT DOCUMENTS

| | | | |
|---|---|---|---|
| 3,873,824 | 3/1975 | Bean et al. | 378/35 |
| 3,892,973 | 7/1975 | Coquin et al. | 378/35 |
| 4,468,799 | 8/1984 | Harms et al. | 378/35 |
| 4,595,649 | 6/1986 | Ferguson et al. | 430/296 |
| 4,680,243 | 7/1987 | Shimkunas | 430/5 |
| 4,939,052 | 7/1990 | Nakagawa | 430/5 |

FOREIGN PATENT DOCUMENTS

| | | |
|---|---|---|
| EP 0083408 | 7/1983 | European Pat. Off. . |
| 3605916 | 9/1987 | Fed. Rep. of Germany . |
| 200415 | 9/1986 | Japan . |
| 214521 | 9/1986 | Japan ................................ 430/5 |
| 40146 | 2/1987 | Japan . |

OTHER PUBLICATIONS

Solid State Technology: "X-Ray Lithography", by R. K. Watts, May 1979, pp. 68-82.
Spie, Submicrom Lithography: "X-Ray Lothography: Fabrication of Masks and Very Large Scale Integrated Devices", by B. B. Triplette et al, vol. 333, 1982, pp. 118-123.
Spie, Electron Beam, X-Ray & Ion-Beam Techniques for Submicrometer Lithographies III: "Defect Repair Techniques for X-Ray Masks", by D. K. Atwood et al, vol. 471, 1984, pp. 127-134.

*Primary Examiner*—Charles L. Bowers, Jr.
*Assistant Examiner*—Thomas R. Neville
*Attorney, Agent, or Firm*—Lowe, Price, LeBlanc and Becker

[57] ABSTRACT

A mask for X-ray lithography includes a transparent thin film (1) formed preferably of SiC, an X-ray absorbing pattern (2) formed preferably of Au formed on the surface of the transparent thin film (1) and a support member (3) formed preferably of Si formed on the back surface of the transparent thin film (1). The support member (3) has an opening (4) for exposing therethrough the back surface of the transparent thin film (1). A transparent conductive thin film (5), preferably of $In_2O_3$, is formed over the back surfaces of both the exposed transparent thin film (1) and the support member (3) to facilitate relaxation electrification of the transparent thin film (1) as may happen during X-ray exposure thereof.

11 Claims, 3 Drawing Sheets

MASK FOR X-RAY LITYHOGRAPHY AND METHOD OF MANUFACTURING THE SAME

This application is a continuation of application Ser. No. 07/168,312, filed Mar. 18, 1988, abandoned.

BACKGROUND OF THE INVENTION

1. Field of the Invention

The present invention relates to the structure of a mask for X-ray lithography (hereinafter referred to as an X-ray mask) serving as an obturating member in the formation of fine patterns of not more than 1 $\mu$m in size, i.e., in the submicron range, such as circuit patterns employed for fabricating a very large scale integrated circuit device (VLSI) through a known X-ray exposure technique (X-ray lithography).

2. Description of the Prior Art

FIG. 1 is a sectional view showing a conventional X-ray mask, which is disclosed in "X-Ray Lithography" by R. K. Watts, May 1979/Solid State Technology, for example. Referring to FIG. 1, a transparent thin film 1, being permeable to visible rays and X-rays, is formed by an insulator of 2 to 3 $\mu$m thickness of a material which is excellent in strength, such as BN, SiN or SiC. X-ray absorbers 2 of heavy metals having high X-ray absorptivity, such as Au, W and Ta, are formed in lamination on the surface of the transparent thin film 1, in correspondence to patterns to be created. The aforementioned literature illustrates an X-ray mask which comprises a transparent thin film 1 of SiC and X-ray absorbers 2 of a Ti film of 150 Å thickness, an Au film of 5000 Å thickness and a V film 800 Å in thickness, which are formed on the SiC thin film. A ring-shaped support member 3 is provided along the peripheral edge portion of the back surface of the transparent thin film 1, to support the transparent thin film 1 and the X-ray absorbers 2. An X-ray transmission window 4, which is an opening defined in the support member 3, has a region corresponding in size to the patterns to be created.

In order to perform exposure through the X-ray mask of such structure, the X-ray mask is first superposed and positioned with a substrate to be exposed, e.g., a semiconductor substrate by visible rays. Visible rays are perpendicularly applied to the surface of the X-ray mask to permeate the same, so that the operation for superposing and positioning the X-ray mask with the substrate is performed on the basis of light visibly reflected by the substrate. Therefore, the transparent thin film 1 must be permeable to visible rays as well as to X-rays. Upon completion of such positioning, X-rays are perpendicularly applied to the surface of the substrate from above, so that those striking the X-ray absorbers 2 are absorbed by the same while those striking other regions permeate the transparent thin film 1 to enter the substrate in correspondence to patterns which are in reverse to the patterns of the X-ray absorbers 2. Thus, as noted the transparent thin film 1 must be permeable both to X-rays and to visible light.

Since X-rays thus enter the substrate in patterns reverse to the patterns of the X-ray absorbers 2, the quality of the patterns formed in the substrate depends on the quality of the X-ray mask patterns. Therefore, the patterns of the X-ray mask must be inspected in advance of employment.

However, the minimum line width of patterns on an X-ray mask is generally less than about 0.5 $\mu$m, and hence sufficient resolution cannot be obtained in pattern inspection through conventional optical techniques, whereby defects, etc., may be overlooked or not detected. Thus, pattern inspection of an X-ray mask has been performed through a pattern inspection apparatus utilizing an electron beam, as disclosed, for example, in Japanese Patent Laying-Open Gazette No. 200415/1986, No. 40146/1987 etc.

The conventional X-ray mask of the aforementioned structure is subjected to pattern inspection by the pattern inspection apparatus utilizing electron beam. Thus, when an electron beam is applied to the transparent thin film 1 a in pattern inspection, the transparent thin film 1 is electrified by injection of electrons, whereby the subsequently applied electron beam is deflected by such electrification of the transparent thin film 1. Consequently, the subsequent electron beam is deflected from its target position, whereby correct pattern inspection cannot be performed.

FIG. 2 shows another conventional X-ray mask, which has been developed to prevent such electrification of the transparent thin film 1, as disclosed in "X-ray lithography: fabrication of masks and very large scale integrated devices", SPIE Vol. 333, Submicron Lithography (1982) and "Defect Repair Techniques for X-ray Masks", SPIE Vol. 471, Electron-Beam, X-Ray, and Ion-Beam Techniques for Submicron-meter Lithographies III (1984). The X-ray mask as shown in FIG. 2 is different from that of FIG. 1 in that a transparent conductive thin film 5 is provided between a transparent thin film 1 and X-ray absorbers 2. According to the first of these references, for example, a Ti film of 10000 Å thickness is formed as transparent conductive thin film 5 on a polyimide film of 16000 Å thickness serving as the transparent thin film 1, and an Au film of 7000 Å thickness and a $TaO_x$ film of 1400 Å thickness are formed thereon as the X-ray absorbers 2. According to the latter reference, on the other hand, a polyimide film of 2 $\mu$m thickness is formed on a BN film of 4.5 $\mu$m thickness serving as the transparent thin film 1, and a Ta film of 300 Å thickness is formed thereon as the transparent conductive film 5, while an Au film of 6500 Å thickness and a Ta film of 800 Å thickness are formed as the X-ray absorbers 2. The latter reference mentions that electrification is caused although X-ray mask patterns as created are subjected to pattern correction by focusing of an ion beam. The transparent conductive thin film 5 is permeable to visible rays and X-rays, similarly to the transparent thin film 1. In this X-ray mask, electrons charged in the transparent thin film 1 escape to the ground through the transparent conductive thin film 5.

In case of thus sandwiching the transparent conductive thin film 5 between the transparent thin film 1 and the X-ray absorbers 2, materials and film forming conditions must be determined consideration of differences in their adhesive properties and the differences in expansibility between the transparent thin film 1, the X-ray absorbers 2 and the transparent conductive thin film 5 in order to manufacture the X-ray mask. The manufacturing steps in such a process are complicated, with a requirement for strict manufacturing conditions.

SUMMARY OF THE INVENTION

Accordingly, the present invention has been proposed to solve the aforementioned problem, and an object thereof is to provide an X-ray mask which can be easily manufactured to relax electrification of a transparent thin film as well as to obtain sharp patterns in X-ray exposures therethrough.

The X-ray mask according to the present invention comprises a transparent thin film that is permeable to at least visible rays and X-rays and X-ray absorbing layers formed on the major front surface of the transparent thin film in a selectively spaced manner to absorb at least X-rays. A support member is formed on the back surface of the transparent thin film to support the transparent thin film and the X-ray absorbing layers. This support member has an opening for exposing at least the back surface of the transparent thin film. Furthermore, a conductive thin film of a conductive substance that is permeable to at least visible rays and X-rays is formed over the back surfaces of the exposed transparent thin film and the support member.

A method of manufacturing an X-ray mask according to the present invention comprises the steps of:

(i) preparing a support substrate;

(ii) forming a transparent thin film that is permeable to at least visible rays and X-rays on the major front surface of the support substrate;

(iii) selectively removing the back surface of the support substrate to define an opening for exposing at least the back surface of the transparent thin film;

(iv) forming an X-ray absorbing layer, for absorbing at least X-rays, on the major front surface of the transparent thin film;

(v) forming a conductive thin film of a conductive substance that is permeable to at least visible rays and X-rays over the back surfaces of the exposed transparent thin film and the support substrate; and (vi) selectively removing parts of the X-ray absorbing layer to form X-ray absorbing patterns in a spaced manner.

In a preferred embodiment of the present invention, the conductive thin film includes an $In_2O_3$ film. The support member is provided in the form of a ring, while the conductive thin film is grounded.

According to the inventive X-ray mask, electrons charged in the transparent thin film in pattern inspection by incidence thereon of an electron beam etc., are emitted to the ground through the conductive thin film. Since the conductive thin film is formed over the back surfaces of both the transparent thin film and the support member, the total thickness of the transparent thin film and the conductive thin film is uniform regardless of the positions of X-ray application. Thus, sharp patterns can be obtained to be transferred in the X-ray exposure through the mask.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
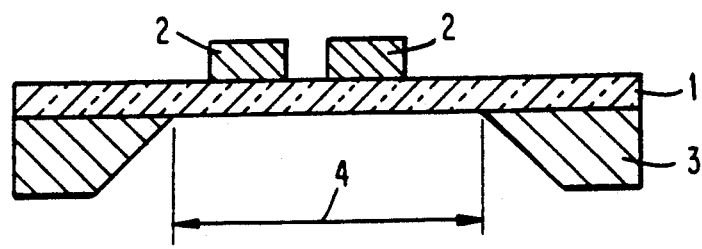
FIG. 1 is a sectional view showing a conventional X-ray mask.
Figure 2:
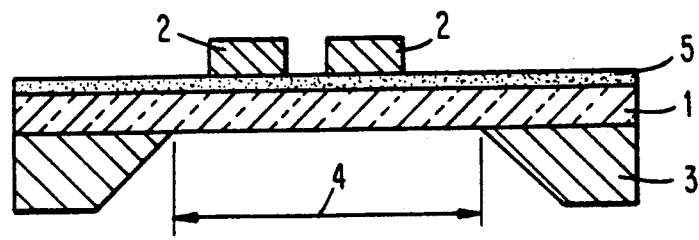
FIG. 2 is a sectional view showing another conventional X-ray mask.
Figure 3:
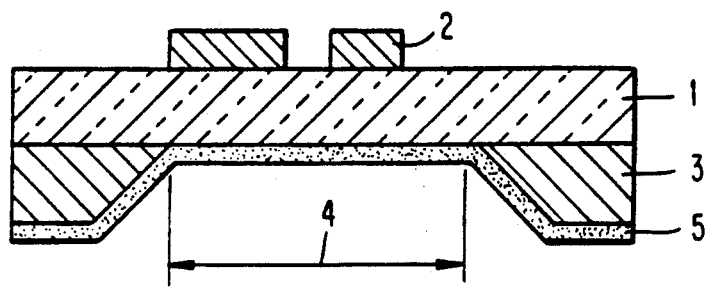
FIG. 3 is a sectional view showing an X-ray mask according to an embodiment of the present invention.

FIG. 3 is a sectional view showing an embodiment of the present invention. Referring to FIG. 3, an X-ray mask according to the present invention is absolutely identical to the conventional X-ray mask as shown in FIG. 1, except for that a transparent conductive thin film 5, preferably formed of $In_2O_3$, is formed in lamination over the back surfaces of a transparent thin film 1 and a support member 3. The transparent conductive thin film 5 is formed of a material selected to be permeable both to visible rays and X-rays, similarly to film 5 shown in FIG. 2 on the upper surface of transparent thin film 1.

Figure 4:
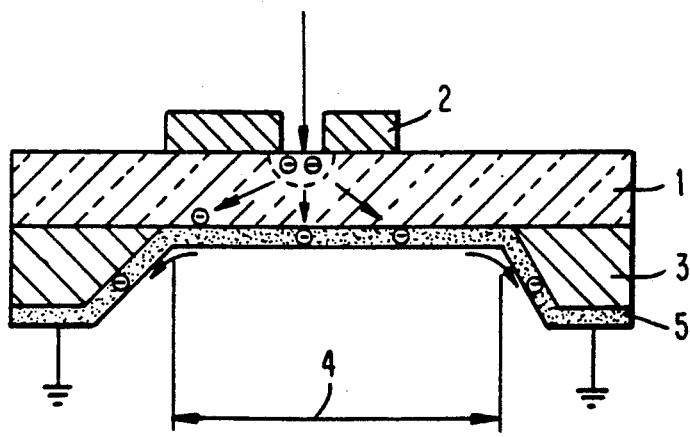
FIG. 4 illustrates the principle of relaxing electrification of a transparent thin film in the X-ray mask according to the present invention.

With reference to FIG. 4, description is now provided on how electrification of the transparent thin film 1 is relaxed in the cause of, for example, a pattern inspection of the X-ray mask through exposure to an electron beam, as illustrated in FIG. 3. When an electron beam is perpendicularly applied to the surface of the X-ray mask, the transparent thin film 1 is electrified in regions not covered by X-ray absorbers. However, the transparent thin film 1 is merely 2 to 3 $\mu m$ in thickness, and hence charged electrons easily move toward the transparent conductive thin film 5. Since the transparent conductive thin film 5 is grounded to the exterior, such electrons pass through the transparent conductive thin film 5 to be emitted toward the exterior of the X-ray mask. Thus, electrification of the transparent thin film 1 can be relaxed.

Figure 5:
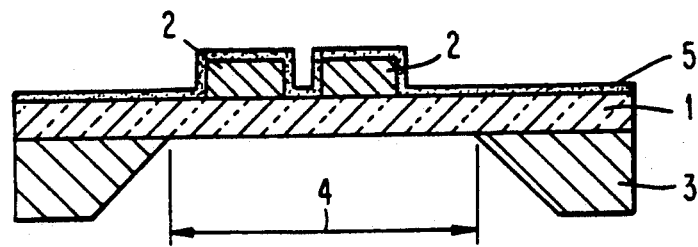
FIG. 5 is a sectional view showing a reference example of an X-ray mask.

While the transparent conductive thin film 5 is formed over the back surfaces of the transparent thin film 1 and the support member 3 in the aforementioned preferred embodiment of this invention, an example comprising a transparent conductive thin film 5 formed on the surfaces of a transparent thin film 1 and X-ray absorbers 2 is illustrated for reference purposes. FIG. 5 is a sectional view showing such a reference example with respect to the above embodiment. This X-ray mask is considered to be relatively easily manufactured to prevent electrification of the transparent thin film 1. Referring to FIG. 5, the X-ray mask illustrated therein is different from the prior art as shown in FIG. 1 in that the transparent conductive thin film 5 is uniformly formed in lamination over both the transparent thin film 1 and the X-ray absorbers 2. Similarly to that shown in FIG. 2, the transparent conductive thin film 5 is permeable to visible rays and X-rays, while being grounded to relax electrification of the transparent thin film 1.

The X-ray mask having the structure illustrated in FIG. 5 can be relatively easily manufactured as compared with that shown in FIG. 2. However, assuming that X-rays are perpendicularly applied to the surface of the X-ray mask from above, a difference in X-ray intensity is caused between X-rays passing through portions of the transparent conductive thin film 5 and the transparent thin film 1 close to edge portions of the X-ray absorbers 2 and those X-rays passing through other portions of the transparent conductive thin film 5 and the transparent thin film 1. Consequently, the patterns transferred in X-ray exposure through the mask are not sharply defined.

Description is now provided on a method of manufacturing the X-ray mask as shown in FIG. 3. FIGS. 6A to 6F are sectional views illustrating steps in a preferred embodiment of the method of manufacturing the X-ray mask according to the present invention.

Figure 6A:
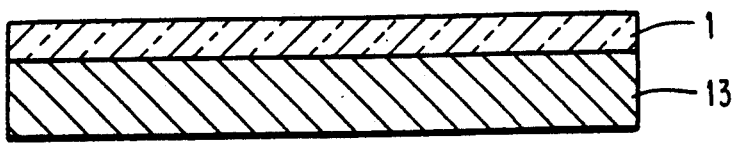
FIGS. 6A, 6B, 6C, 6D, 6E and 6F are sectional views illustrating various steps in a method of manufacturing the X-ray mask according to the present invention.
Figure 6B:
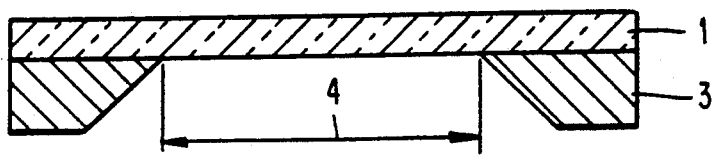
Figure 6C:
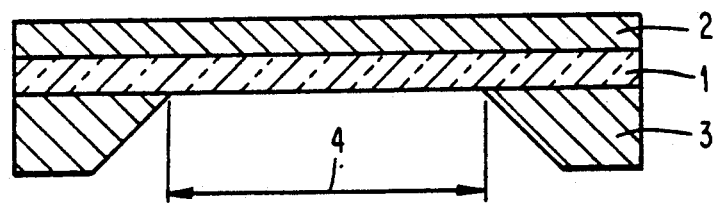
Figure 6D:
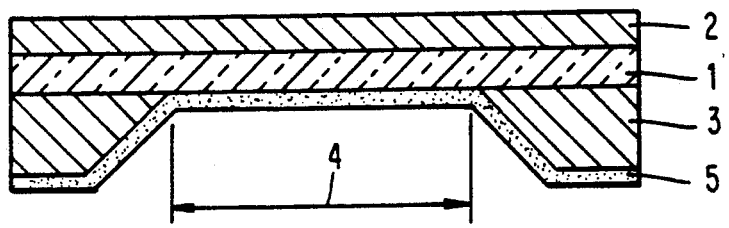
Figure 6E:
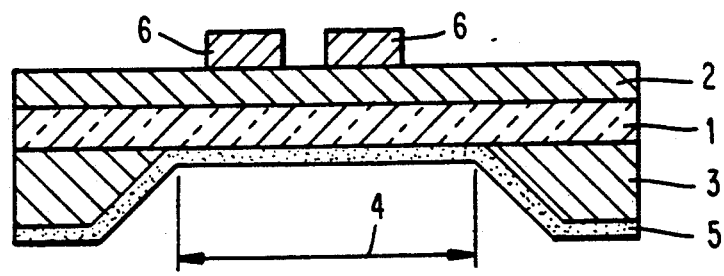
Figure 6F:
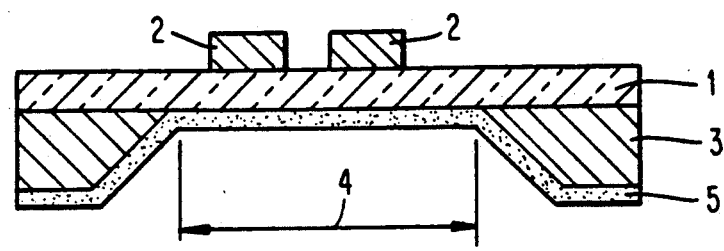

Referring to FIG. 6A, a transparent thin film 1 of BN, SiN, SiC or the like, having a thickness of 2 to 3 μm, is uniformly formed in lamination on a support substrate 13 of Si or the like, that is formed to thickness of about 1 to 2 mm by low pressure chemical vapor deposition (LPCVD). Then, as shown in FIG. 6B, wet etching is performed on the back surface of the support substrate 13 through photolithography to define a region for transmitting X-rays in correspondence to a substrate, thereby to form a support member 3 and an X-ray transmission window 4. Referring to FIG. 6C, an X-ray absorber 2 of a material having high X-ray absorptivity such as Au, W, Ta or Pb is uniformly formed in lamination on the surface of the transparent thin film 1 to be in thickness of 0.8 to 1 μm, by sputtering. Then, as shown in FIG. 6D, a transparent conductive thin film 5 of $In_2O_3$ of about 1000 Å in thickness is uniformly formed in lamination over the back surfaces of the transparent thin film 1 and the support member 3. The transparent conductive thin film 5 can be formed by any known film forming method such as sputtering, chemical vapor deposition (CVD), etc. Referring to FIG. 6E, mask patterns 6 of resist corresponding to desired circuit patterns or the like are formed on the X-ray absorber 2 through an electron beam exposure technique (electron beam lithography). Then, as shown in FIG. 6F, dry etching is performed on the X-ray absorber 2 through the mask patterns 6, to leave only regions of the X-ray absorber 2 corresponding to the mask patterns 6 while removing other regions. Thereafter the mask patterns 6 are removed, to define desired patterns of the X-ray absorber 2 on the transparent thin film 1.

Through the aforementioned steps, an X-ray mask capable of relaxing electrification of the transparent thin film 1 can be manufactured. According to the aforementioned manufacturing method, only one surface of the transparent conductive thin film 5 relates to junction particularly in the step (FIG. 6D) of forming the transparent conductive thin film 5 in lamination over the back surfaces of the transparent thin film 1 and the support member 3, whereby manufacturing conditions such as the material for the transparent conductive thin film 5 and film forming conditions can be relatively freely determined as compared with the known X-ray mask, illustrated in FIG. 2 having the transparent conductive thin film 5 in a sandwich structure. In the mask manufactured according to the present invention, in a region of the transparent conductive thin film 5 corresponding to the X-ray transmission window 4, the transparent thin film 1 and the transparent conductive thin film 5 are substantially uniform in thickness with respect to the direction of incidence of X-rays, hence X-rays permeating the transparent thin film 1 and the transparent conductive thin film 5 to reach the substrate are substantially equal in intensity regardless of the position of their application, which eliminates problems of poor contrast due to differences in X-ray intensity between edge portions of the X-ray absorbers 2 and other portions as shown in FIG. 5.

Also, in pattern correction by ion beam or pattern etching by ion plasma, electrification of the X-ray mask can be relaxed by forming the X-ray mask similarly to the above embodiment.

Although the transparent conductive thin film 5 is formed of $In_2O_3$ in the above embodiment, the same may be formed of ZnO. Alternatively, the transparent conductive thin film 5 may be formed by a metal thin film in a thickness permeable to visible rays. However, if such a metal thin film is prepared by a material having high X-ray absorptivity the throughput in any X-ray exposure is reduced. Therefore, the metal thin film is preferably formed of a light metal such as Ti.

Further, although the transparent conductive thin film 5 is formed in lamination over the back surfaces of the transparent thin film 1 and the support member 3 after the X-ray absorber 2 is formed in uniform lamination on the surface of the transparent thin film 1 (FIG. 6C) in the aforementioned steps of manufacturing the X-ray mask, the transparent conductive thin film 5 may be formed in any stage so long as it is formed after formation of the support member 3 and the X-ray transmission window 4 and before etching of the X-ray absorber 2.

According to the present invention as hereinabove described, the transparent conductive thin film is formed in lamination over the back surfaces of the transparent thin film and the support member, whereby electrification of the transparent thin film is relaxed in pattern inspection of the X-ray mask by electron beam etc. Thus, an X-ray mask, which enables pattern inspection, etc., to a higher accuracy, can be relatively easily obtained. Through employment of such an X-ray mask, sharp patterns can be created in X-ray exposure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A mask for X-ray lithography, comprising:
   a transparent thin film having a major front surface and a back surface, permeable to at least visible rays and X-rays;
   X-ray absorbing layers formed on the front surface of said transparent thin film selectively in a spaced manner for absorbing at least X-rays;
   a support member formed to have a front surface thereof attached to the back surface of said transparent thin film for supporting said transparent thin film and said X-ray absorbing layers formed on the front surface thereof, said support member having an opening for exposing at least a portion of the back surface of said transparent thin film; and
   a conductive thin film, formed over the back surface of said exposed transparent thin film and a back surface of said support member, said conductive thin film being of a conductive substance and permeable to at least visible rays and X-rays and being disposed to provide a conductive path for electrons charged in said transparent thin film.

2. A mask for X-ray lithography in accordance with claim 1, wherein:
   said conductive thin film comprises $In_2O_3$.

3. A mask for X-ray lithography in accordance with claim 1, wherein:
   said conductive thin film comprises ZnO.

4. A mask for X-ray lithography in accordance with claim 1, wherein:
   said conductive thin film comprises Ti.

5. A mask for X-ray lithography in accordance with claim 1, wherein:
   said support member is provided in the form of a ring.

6. A mask for X-ray lithography in accordance with claim 1, wherein:
said conductive thin film is grounded.

7. A method of manufacturing a mask for X-ray lithography, comprising the steps of:
  (a) forming a transparent thin film that is permeable to at least visible rays and X-rays, on a front surface of a support substrate such that a back surface of the thin film is attached to the front surface of the support and a front surface of the thin film is available to receive at least X-rays;
  (b) selectively removing a portion of the support substrate to define an opening for exposing a portion of the back surface of said transparent thin film;
  (c) forming an X-ray absorbing layer on the front surface of said transparent thin film for absorbing X-rays;
  (d) forming a conductive thin film over the back surface of said exposed transparent thin film and a back surface of said support substrate, said conductive thin film being of a conductive substance and permeable to visible rays and X-rays and formed to be grounded to provide a path to charged electrons from said transparent thin film to discharge the same when exposed to an election beam; and
  (e) selectively removing parts of said X-ray absorbing layer for forming X-ray absorbing patterns in a spaced manner.

8. A method of manufacturing a mask for X-ray lithography in accordance with claim 7, wherein:
said step of forming said conductive thin film includes formation of an $IN_2O_3$ film.

9. A method of manufacturing a mask for X-ray lithography in accordance with claim 7, wherein:
said step of forming said conductive thin film includes formation of a ZnO film.

10. A method of manufacturing a mask for X-ray lithography in accordance with claim 7, wherein:
said step of forming said conductive thin film includes formation of a Ti film.

11. A method of manufacturing a mask for X-ray lithography according to claim 7, wherein:
said step (e) of selectively removing parts of the X-ray absorbing layer includes dry etching and is performed after said step (d) of forming said conductive thin film.

* * * * *